(12) United States Patent
Inbaraj et al.

(10) Patent No.: US 10,496,507 B2
(45) Date of Patent: Dec. 3, 2019

(54) DYNAMIC PERSONALITY CONFIGURATIONS FOR POOLED SYSTEM MANAGEMENT ENGINE

(71) Applicant: American Megatrends International, LLC, Norcross, GA (US)

(72) Inventors: Joseprabu Inbaraj, Suwanee, GA (US); Sanjoy Maity, Snellville, GA (US); Chandrasekar Rathineswaran, Cumming, GA (US)

(73) Assignee: AMERICAN MEGATRENDS INTERNATIONAL, LLC, Norcross, GA (US)

( * ) Notice: Subject to any disclaimer, the term of this patent is extended or adjusted under 35 U.S.C. 154(b) by 25 days.

(21) Appl. No.: 15/711,539

(22) Filed: Sep. 21, 2017

(65) Prior Publication Data
US 2019/0087297 A1 Mar. 21, 2019

(51) Int. Cl.
*G06F 15/173* (2006.01)
*G06F 11/30* (2006.01)
*H05K 7/14* (2006.01)

(52) U.S. Cl.
CPC ...... *G06F 11/3006* (2013.01); *G06F 11/3034* (2013.01); *G06F 11/3044* (2013.01); *H05K 7/1485* (2013.01); *H05K 7/1494* (2013.01)

(58) Field of Classification Search
CPC ............ G06F 11/3006; G06F 11/3034; G06F 11/3044; H05K 7/1485; H05K 7/1494

USPC .................................................. 709/224, 223
See application file for complete search history.

(56) References Cited

U.S. PATENT DOCUMENTS

| | | | |
|---|---|---|---|
| 2011/0145540 A1* | 6/2011 | Duisenberg | G06F 9/5077 711/173 |
| 2017/0054603 A1* | 2/2017 | Kulkarni | H04L 41/0893 |
| 2017/0289256 A1* | 10/2017 | Kumar | H04L 67/125 |
| 2018/0027063 A1* | 1/2018 | Nachimuthu | G06F 3/0613 709/226 |
| 2018/0034909 A1* | 2/2018 | Nachimuthu | H04L 41/0813 |
| 2018/0285123 A1* | 10/2018 | Kumar | G06F 13/385 |
| 2018/0324052 A1* | 11/2018 | Nachimuthu | H04Q 9/00 |

* cited by examiner

Primary Examiner — Philip B Tran
(74) Attorney, Agent, or Firm — Locke Lord LLP; Tim Tingkang Xia, Esq.

(57) ABSTRACT

A computing pod includes one or more computing racks. Each of the one or more computing racks includes one or more computing drawers. Each of the computing drawers includes one or more computing modules. Each of the one or more computing modules includes a computing blade. A first service processor is on a first computing blade of a first computing drawer of the one or more computing drawers of a first computing rack of the one or more computing racks. The first service processor executes a first BMC function. The first BMC function manages the first computing blade. The first service processor determines a type of the first computing blade. The first service processor configures a first PSME in accordance with the determined type.

17 Claims, 6 Drawing Sheets

DYNAMIC PERSONALITY CONFIGURATIONS FOR POOLED SYSTEM MANAGEMENT ENGINE

BACKGROUND

Field

The present disclosure relates generally to computer systems, and more particularly, to techniques for configuring personality of a pooled system management engine (PSME) in a computing pod.

Background

The statements in this section merely provide background information related to the present disclosure and may not constitute prior art.

Technological advancements in networking have enabled the rise in use of pooled and/or configurable computing resources. These pooled and/or configurable computing resources may include physical infrastructure for cloud computing networks. The physical infrastructure may include one or more computing systems having processors, memory, storage, networking, etc. Management entities of these cloud computing networks may allocate portions of pooled and/or configurable computing resources in order to place or compose a machine or server to implement, execute or run a workload. Various types of applications or application workloads may utilize this allocated infrastructure in a shared manner via access to these placed or composed machines or servers. As such, there is a need to optimize resources used to manage the physical infrastructure.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and a computing pod are provided. The computing pod includes one or more computing racks. Each of the one or more computing racks includes one or more computing drawers. Each of the computing drawers includes one or more computing modules. Each of the one or more computing modules includes a computing blade. A first service processor is on a first computing blade of a first computing drawer of the one or more computing drawers of a first computing rack of the one or more computing racks. The first service processor executes a first BMC function. The first BMC function manages the first computing blade. The first service processor determines a type of the first computing blade. The first service processor configures a first PSME in accordance with the determined type. The first service processor exposes the first PSME to a pod manager servicing the pod. The first PSME collects information of the first computing blade. The first PSME sends the information of the first computing blade to the pod manager.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of computer systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

Figure 1:
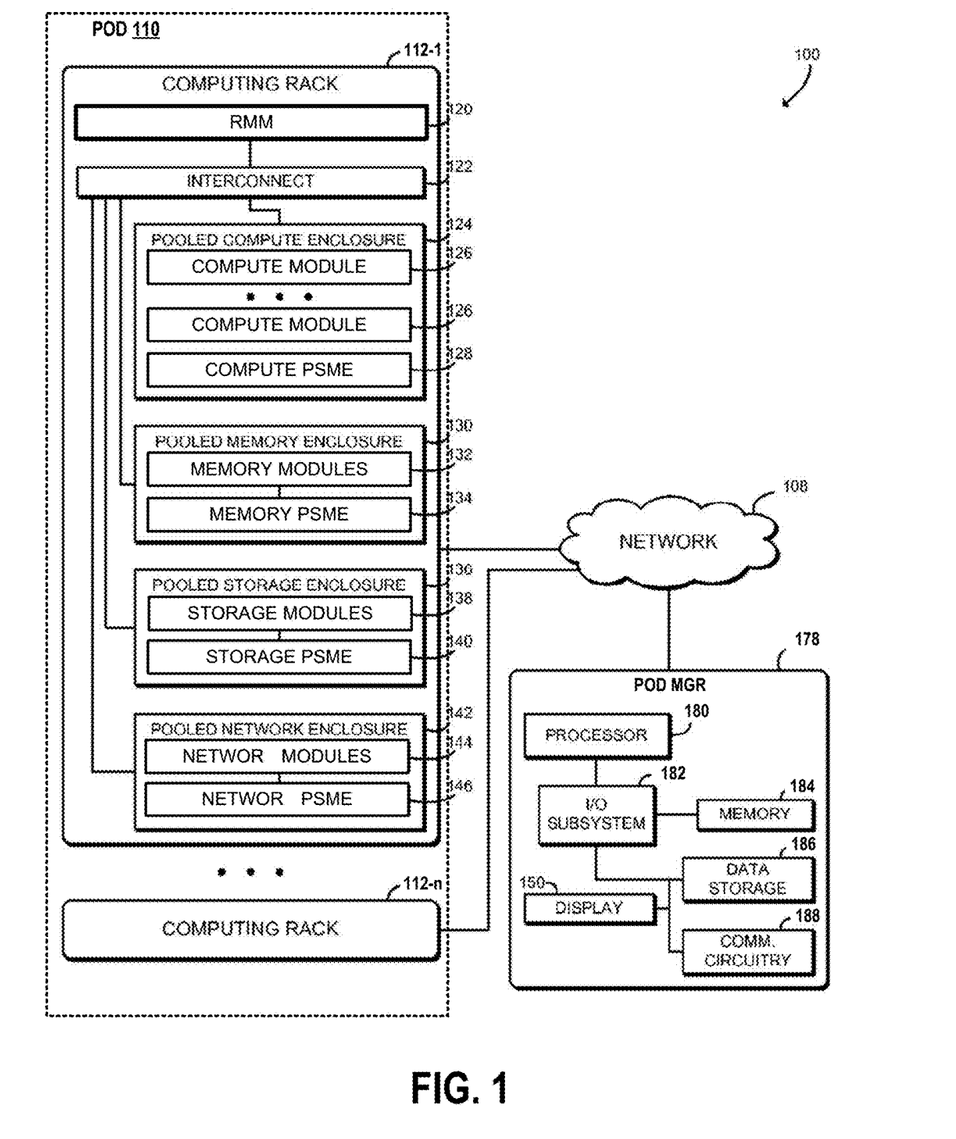
FIG. 1 is a diagram illustrating a computer system.

FIG. 1 is a diagram illustrating a system 100 including computing racks 112-1 to 112-n and a pod manager 178 in communication over a network 108. The computing racks 112-1 to 112-n collectively constitute a computing pod 110, which is managed by the pod manager 178 as described infra. In general, a pod is a collection of computing racks within a shared infrastructure domain.

In use, computing applications or other workloads may be distributed over any number of the computing racks 112-1 to 112-n using available computing elements of the system 100 (e.g., compute nodes, memory, storage, or networking). The pod manager 178 manages resources of the system 100, for example including the current distribution and scheduling of workloads among the computing elements of the computing racks 112-1 to 112-n. The pod manager 178 can translate human input received into a number of machine-readable user-defined optimization rules. The pod manager 178 can optimize workload of the computing racks 112-1 to 112-n (e.g., optimize the placement and/or scheduling of workloads among the computing elements of the system 100) using the user-defined optimization rules well as predefined goals and constraints.

The system 100 may allow improved scheduling and placement of workload in a highly heterogeneous (e.g., disaggregated and/or modular) datacenter environment, with multiple internal (e.g., efficiency) and/or external (e.g., service delivery objective) constraints. Additionally, the system 100 may enable service providers to offer a wide range of service levels and templates to customers, due to the service provider's ability to optimally profit from all computing elements of the system 100 while managing operational cost tightly. Additionally, although described as being performed by the pod manager 178, in certain configurations some or all of those functions may be performed by other elements of the system 100, such as one or more computing racks 112-1 to 112-n.

Each of the computing racks 112-1 to 112-n may be embodied as a modular computing device that, alone or in combination with other computing racks 112-1 to 112-n, is capable of performing the functions described herein. For example, the computing rack 112-1 may be embodied as a chassis for rack-mounting modular computing units such as compute drawer/trays, storage drawer/trays, network drawer/trays, and/or traditional rack-mounted components such as servers or switches.

In this example, each of the computing racks 112-1 to 112-n may include a rack management module (RMM) 120 and one or more of an interconnect 122 coupled to a pooled compute enclosure 124, a pooled memory enclosure 130, a pooled storage enclosure 136, and a pooled network enclosure 142. The RMM 120 is responsible for managing the rack, which may include assigning IDs for pooled system management engines (PSMEs) and managing the rack power and cooling. Of course, each of the computing racks 112-1 to 112-n may include other or additional components, such as those commonly found in a server device (e.g., power distribution systems, cooling systems, or various input/output devices), in other embodiments.

In certain configurations, each of the pooled compute enclosure 124, the pooled memory enclosure 130, the pooled storage enclosure 136, and the pooled network enclosure 142 may be embodied as a tray, expansion board, or any other form factor, and may be further referred to as a "drawer." In such configurations, each enclosure/drawer may include any number of function modules or computing components, which may be allocated to an application or workload. As each of the computing racks 112-1 to 112-n includes drawers, individual components may be replaced or upgraded and may be "hot swappable." For example, in certain configurations, the pooled compute enclosure 124 may be embodied as a CPU tray including one or more compute modules 126. Each compute module 126 may include a blade having multiple processors and/or processing/controlling circuits. In such configurations, additional processing power may be added to the computing rack 112-1 by swapping out the pooled compute enclosure 124 with another pooled compute enclosure 124 including newer and/or more powerful processors.

The pooled compute enclosure 124 may be embodied as any modular computing unit such as a compute tray, expansion board, chassis, or other modular unit. As described supra, the pooled compute enclosure 124 may include one or more compute modules 126. Each compute module 126 may include a processor blade capable of performing the functions described herein. Each processor blade may include a single or multi-core processor(s), digital signal processor, microcontroller, or other processor or processing/controlling circuit. The compute modules 126 may be heterogeneous; for example, some of the compute modules 126 may be embodied as high-performance server processors and others of the compute modules 126 may be embodied as low-powered processors suitable for higher density deployment.

Further, in certain configurations, the pooled compute enclosure 124 may include a compute PSME 128. The compute PSME 128 may be embodied as any performance counter, performance monitoring unit, or other hardware monitor capable of generating, measuring, or otherwise capturing performance metrics of the compute modules 126 and/or other components of the pooled compute enclosure 124.

The pooled memory enclosure 130 may be embodied as any modular memory unit such as a memory tray, expansion board, chassis, or other modular unit. The pooled memory enclosure 130 includes memory modules 132. Each of the memory modules 132 may have a memory blade containing one or more memories capable of being partitioned, allocated, or otherwise assigned for use by one or more of the compute modules 126 of the pooled compute enclosure 124. For example, the memory blade may contain a pooled memory controller coupled to volatile or non-volatile memory, such as a large number of conventional RAM DIMMs. In operation, the pooled memory enclosure 130 may store various data and software used during operation of the computing rack 112-1 such as operating systems, virtual machine monitors, and user workloads.

Further, in certain configurations, the pooled memory enclosure 130 may include a memory PSME 134. The memory PSME 134 may be embodied as any performance counter, performance monitoring unit, or other hardware monitor capable of generating, measuring, or otherwise capturing performance metrics of the memory modules 132 and/or other components of the pooled memory enclosure 130.

Similarly, the pooled storage enclosure 136 may be embodied as any modular storage unit such as a storage tray, expansion board, chassis, or other modular unit. The pooled storage enclosure 136 includes storage modules 138. Each of the storage modules 138 may have a storage blade containing any type of data storage capable of being partitioned, allocated, or otherwise assigned for use by one or more of the compute modules 126 of the pooled compute enclosure 124. For example, the storage blade may contain one or more memory devices and circuits, memory cards, hard disk drives, solid-state drives, or other data storage devices. Further, the storage modules 138 may be configured to store one or more operating systems to be initialized and/or executed by the computing rack 112-1.

Further, in certain configurations, the pooled storage enclosure 136 may include a storage PSME 140. The storage PSME 140 may be embodied as any performance counter, performance monitoring unit, or other hardware monitor capable of generating, measuring, or otherwise capturing performance metrics of the storage modules 138 and/or other components of the pooled storage enclosure 136.

Similarly, the pooled network enclosure 142 may be embodied as any modular network unit such as a network tray, expansion board, chassis, or other modular unit. The pooled network enclosure 142 includes network modules 144. Each of the network modules 144 may have a blade containing any communication circuit, device, or collection thereof, capable of being partitioned, allocated, or otherwise assigned for use by one or more of the compute modules 126 of the pooled compute enclosure 124. For example, the network blade may contain any number of network interface ports, cards, or switches. In certain configurations, the network modules 144 may be capable of operating in a software-defined network (SDN). The network modules 144 may be configured to use any one or more communication technology (e.g., wired or wireless communications) and associated protocols (e.g., Ethernet, Bluetooth®, Wi-Fi®, WiMAX, etc.) to effect such communication.

Further, in certain configurations, the network enclosure 142 may include a network PSME 146. The network PSME 146 may be embodied as any performance counter, performance monitoring unit, or other hardware monitor capable of generating, measuring, or otherwise capturing performance metrics of the network modules 144 and/or other components of the pooled network enclosure 142.

In certain configurations, the pooled compute enclosure 124, the pooled memory enclosure 130, the pooled storage enclosure 136, and the pooled network enclosure 142 are coupled to each other and to other computing racks 112-1 to 112-n through the interconnect 122. The interconnect 122 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate data transfer between the computing elements of the computing rack 112-1. For example, in certain configurations, the interconnect 122 may be embodied as or include a silicon photonics switch fabric and a number of optical interconnects. Additionally or alternatively, in certain configurations, the interconnect 122 may be embodied as or include a top-of-rack switch.

The RMM 120 may be implemented by any computing node, micro-controller, or other computing device capable of performing workload management and orchestration functions for the computing rack 112-1 and otherwise performing the functions described herein. For example, the RMM 120 may be embodied as one or more computer servers, embedded computing devices, managed network devices, managed switches, or other computation devices. In certain configurations, the RMM 120 may be incorporated or otherwise combined with the interconnect 122, for example in a top-of-rack switch.

As described supra, in certain configurations, the system 100 may include a pod manager 178. A pod manager 178 is configured to provide an interface for a user to orchestrate, administer, or otherwise manage the system 100. The pod manager 178 may be embodied as any type of computation or computer device capable of performing the functions described herein, including, without limitation, a computer, a multiprocessor system, a server, a rack-mounted server, a blade server, a laptop computer, a notebook computer, a tablet computer, a wearable computing device, a network appliance, a web appliance, a distributed computing system, a processor-based system, and/or a consumer electronic device. In certain configurations, the pod manager 178 may be embodied as a distributed system, for example with some or all computational functions performed by the computing racks 112-1 to 112-n and with user interface functions performed by the pod manager 178. Accordingly, although the pod manager 178 is illustrated in FIG. 1 as embodied as a single server computing device, it should be appreciated that the pod manager 178 may be embodied as multiple devices cooperating together to facilitate the functionality described infra. As shown in FIG. 1, the pod manager 178 illustratively includes a processor 180, an input/output subsystem 182, a memory 184, a data storage device 186, and communication circuitry 188. Of course, the pod manager 178 may include other or additional components, such as those commonly found in a workstation (e.g., various input/output devices), in other embodiments. Additionally, in certain configurations, one or more of the illustrative components may be incorporated in, or otherwise form a portion of, another component. For example, the memory 184, or portions thereof, may be incorporated in the processor 180 in certain configurations.

The processor 180 may be embodied as any type of processor capable of performing the functions described herein. The processor 180 may be embodied as a single or multi-core processor(s), digital signal processor, micro-controller, or other processor or processing/controlling circuit. Similarly, the memory 184 may be embodied as any type of volatile or non-volatile memory or data storage capable of performing the functions described herein. In operation, the memory 184 may store various data and software used during operation of the pod manager 178 such as operating systems, applications, programs, libraries, and drivers. The memory 184 is communicatively coupled to the processor 180 via the I/O subsystem 182, which may be embodied as circuitry and/or components to facilitate input/output operations with the processor 180, the memory 184, and other components of the pod manager 178. For example, the I/O subsystem 182 may be embodied as, or otherwise include, memory controller hubs, input/output control hubs, integrated sensor hubs, firmware devices, communication links (i.e., point-to-point links, bus links, wires, cables, light guides, printed circuit board traces, etc.) and/or other components and subsystems to facilitate the input/output operations. In certain configurations, the I/O subsystem 182 may form a portion of a system-on-a-chip (SoC) and be incorporated, along with the processor 180, the memory 184, and other components of the pod manager 178, on a single integrated circuit chip.

The data storage device 186 may be embodied as any type of device or devices configured for short-term or long-term storage of data such as, for example, memory devices and circuits, memory cards, hard disk drives, solid-state drives, or other data storage devices. The communication circuitry 188 of the pod manager 178 may be embodied as any communication circuit, device, or collection thereof, capable of enabling communications between the pod manager 178, the computing racks 112-1 to 112-n, and/or other remote devices over the network 108. The communication circuitry 188 may be configured to use any one or more communication technology (e.g., wired or wireless communications) and associated protocols (e.g., Ethernet, Bluetooth®, Wi-Fi®, WiMAX, etc.) to effect such communication.

The pod manager 178 further includes a display 190. The display 190 of the pod manager 178 may be embodied as any type of display capable of displaying digital information such as a liquid crystal display (LCD), a light emitting diode (LED), a plasma display, a cathode ray tube (CRT), or other type of display device. As further described below, the display 190 may present an interactive graphical user interface for management of the system 100.

As described infra, the computing racks 112-1 to 112-n and the pod manager 178 may be configured to transmit and receive data with each other and/or other devices of the system 100 over the network 108. The network 108 may be embodied as any number of various wired and/or wireless networks. For example, the network 108 may be embodied as, or otherwise include, a wired or wireless local area network (LAN), a wired or wireless wide area network (WAN), a cellular network, and/or a publicly-accessible, global network such as the Internet. As such, the network 108 may include any number of additional devices, such as additional computers, routers, and switches, to facilitate communications among the devices of the system 100.

In certain configurations, one or more of the illustrative components may be incorporated in, or otherwise form a portion of, another component. For example, the one or more of the pooled memory enclosures 130, or portions thereof, may be incorporated in one or more of the pooled compute enclosures 124. Similarly, although each of the computing racks 112-1 to 112-n is illustrated as including a single pooled compute enclosure 124, a single pooled memory enclosure 130, a single pooled storage enclosure 136, and a single pooled network enclosure 142, it should be understood that each of the computing racks 112-1 to 112-n may include any number and/or combination of those modular enclosures.

Figure 2:
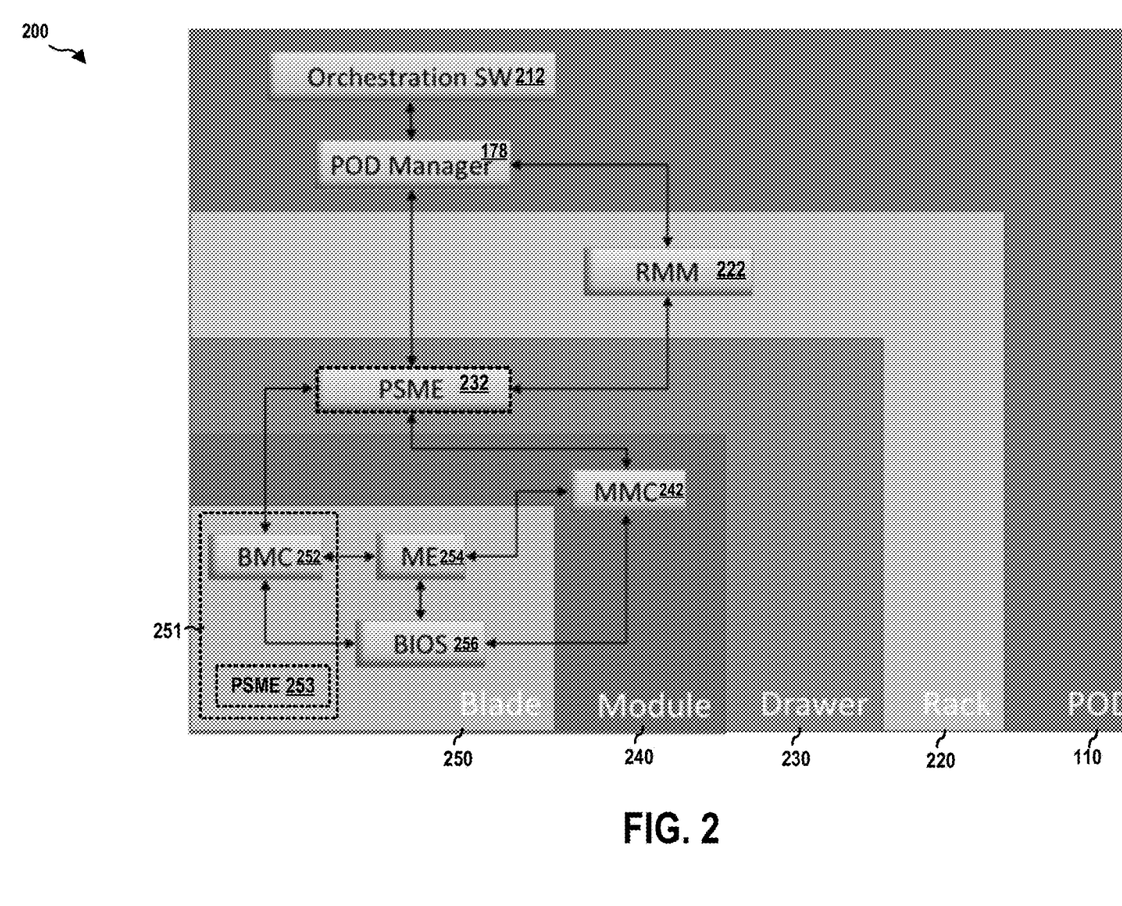
FIG. 2 is a diagram illustrating a logical hierarchy of a computer system.

FIG. 2 is a diagram 200 illustrating a logical hierarchy of the system 100. As described supra, the pod manager 178 manages the computing pod 110. An orchestration module 212 may send a request to the pod manager 178 for a composed machine. Accordingly, the pod manager 178 may allocate resources of the computing pod 110 to build the requested composed machine. A composed machine may include resources from compute, memory, network, and storage modules.

Further, as shown, the computing pod 110 includes at least one computing rack 220. Each computing rack 220, which may be any one of the computing racks 112-1 to 112-n, includes a RMM 222 (e.g., the RMM 120). The computing rack 220 also includes at least one computing drawer 230, each of which may be any one of the pooled compute enclosure 124, the pooled memory enclosure 130, the pooled storage enclosure 136, and the pooled network enclosure 142. In certain configurations, each computing drawer 230 may include a PSME 232, which may be any corresponding one of the compute PSME 128, the memory PSME 134, the storage PSME 140, and the network PSME 146.

The computing drawer 230 also includes at least one module 240, which may be any corresponding one of the compute module 126, the memory module 132, the storage module 138, and the network module 144. Each module 240 includes a module management controller (MMC) 242 that services the module 240 and manages the blades in the module 240.

Each module 240 also includes at least one computing blade 250. Each computing blade 250 includes a (baseboard management controller) BMC function 252, a (management engine) ME 254, and a (Basic Input/Output System) BIOS 256. The PSME 232 is in communication with the MMC 242 and the BMC function 252. The BMC function 252 is in communication with the BIOS 256 and the ME 254.

In particular, the pod manager 178 is responsible for discovery of resources in the computing pod 110, configuring the resources, power and reset control, power management, fault management, monitoring the resources usage. The pod manager 178 interacts with the RMM 120 and the PSME 232 to create representation of the computing pod 110. The pod manager 178 allows composing a physical node to match the logical node requirements specified by the solution stack. Such composition is able to specify a system at a sub-composed node granularity.

The pod manager 178 may be connected to the RMM 222 and the PSME 232 through the network 108 (e.g., a private network). A management related activity such as reconfiguration may be performed after establishing a secure communication channel between the pod manager 178 and the PSME 232 and between the pod manager 178 and the RMM 222.

The RMM 222 may be responsible for handling infrastructure functions of the computing rack 220 such as power, cooling, and assigning PSME IDs. The RMM 222 may also support power monitoring at rack level. This feature helps the pod manager 178 take actions to keep the rack within its power budget.

As described supra, the computing rack 220 is made-up of drawers such as the computing drawer 230. The computing rack 220 provides a mechanism to manage rack level end point components down to the drawer level. In particular, the PSME 232 provides management interface to manage the modules/blades (e.g., the module 240/the computing blade 250) at a drawer level. In certain configurations, the PSME 232 may service multiple drawers, as long as the drawer is uniquely addressable and provides the necessary instrumentation. For example, if each drawer has a microcontroller to provide the necessary instrumentation for all drawer requirements (such as module presence detection) and is interfaced to the RMM 222, then the PSME 232 could physically run in the RMM 222 and represent each drawer instance.

In certain configurations, the PSME 232 may be responsible for drawer identification management and for communicating with the BMC function 252 and the MMC 242 perform node-level management. If the RMM 222 is not present in the computing rack 220, the PSME 232 in the computing rack 220 would provide the RMM functionality. The PSME 232 may also provide individual node reset support including power on and power off of the drawer and modules (e.g., the module 240 and the computing blade 250) that are managed by the PSME 232.

In certain configurations, as described infra, the computing drawer 230 does not have a PSME at the drawer level (e.g., the PSME 232). Rather, a service processor 251 on the computing blade 250 implementing the BMC function 252 also implements a PSME 253. The PSME 253 is in communication with the pod manager 178, the RMM 222, the MMC 242, the BMC function 252 and performs some or all of the functions that would be performed by the PSME 232.

Figure 3:
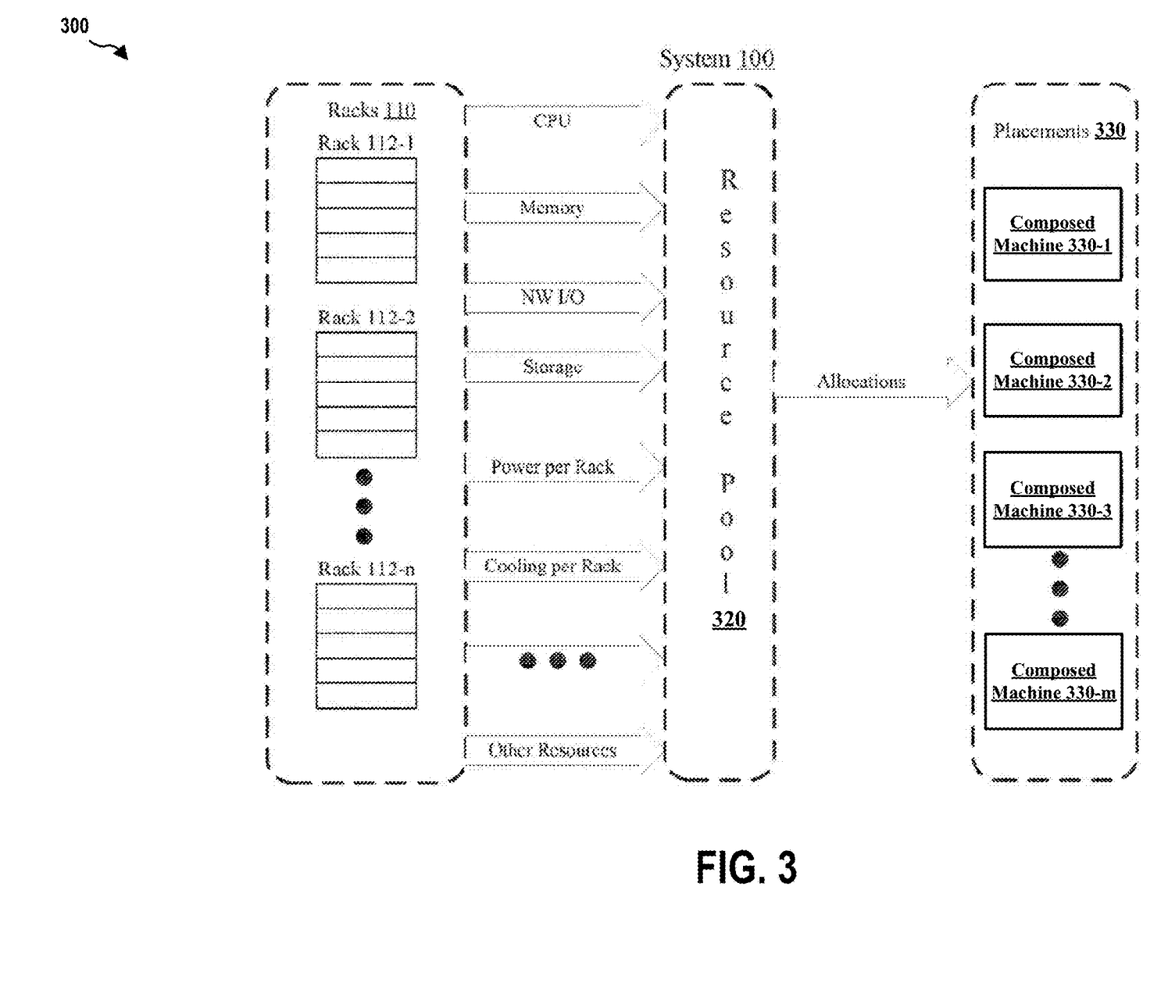
FIG. 3 is a diagram illustrating allocation of resources of a computer system.

FIG. 3 is a diagram 300 illustrating allocation of resources of the system 100. In certain configurations, as described supra, machines (or servers) can be logically composed from pools of disaggregated physical elements of the system 100 to implement or execute incoming workload requests. These composed machines may be deployed in large data centers. The composed machines may also be part of software defined infrastructure (SDI). SDI-enabled data centers may include dynamically composed machines to implement or execute workloads.

As described supra, the system 100 may include the computing racks 112-1 to 112-n, where "n" is a positive integer. Each rack may include various configurable computing resources. These configurable computing resources may include various types of disaggregated physical elements. Types of disaggregated physical elements may include, but are not limited to, CPU types (e.g., the compute modules 126), memory types (e.g., the memory modules 132), storage types (e.g., the storage modules 138), network I/O types (e.g., the network modules 144), power types (e.g., power bricks), cooling types (e.g., fans or coolant) or other types of resources (e.g., network switch types). These configurable computing resources may be made available (e.g., to a resource manager or controller) in a resource pool 320.

In certain configurations, various configurable computing resources of the system 100 may be made available in the resource pool 320 for allocation to build a composed machine. A composed machine, for example, may be composed to implement or execute a workload. At least a portion (e.g., a configuration) of available configurable computing resources in the resource pool may be allocated to support placements 330. As shown in FIG. 3, placements 330 include composed machines 332-1 to 332-m, where "m" is any positive integer.

As described infra, certain logic and/or features of the system 100 may also be capable of monitoring operating attributes for each configurable computing resource allocated to compose or place a composed machine while the composed machine implements, runs or executes a workload.

According to some examples, each of the composed machines 332-1 to 332-m may be used to run one or more virtual machines (VMs). For these examples, each of the one or VMs may be allocated a portion of a composed machine (i.e., allocated configurable computing resources). In other examples, a composed machine may be allocated directly to a given VM.

Figure 4:
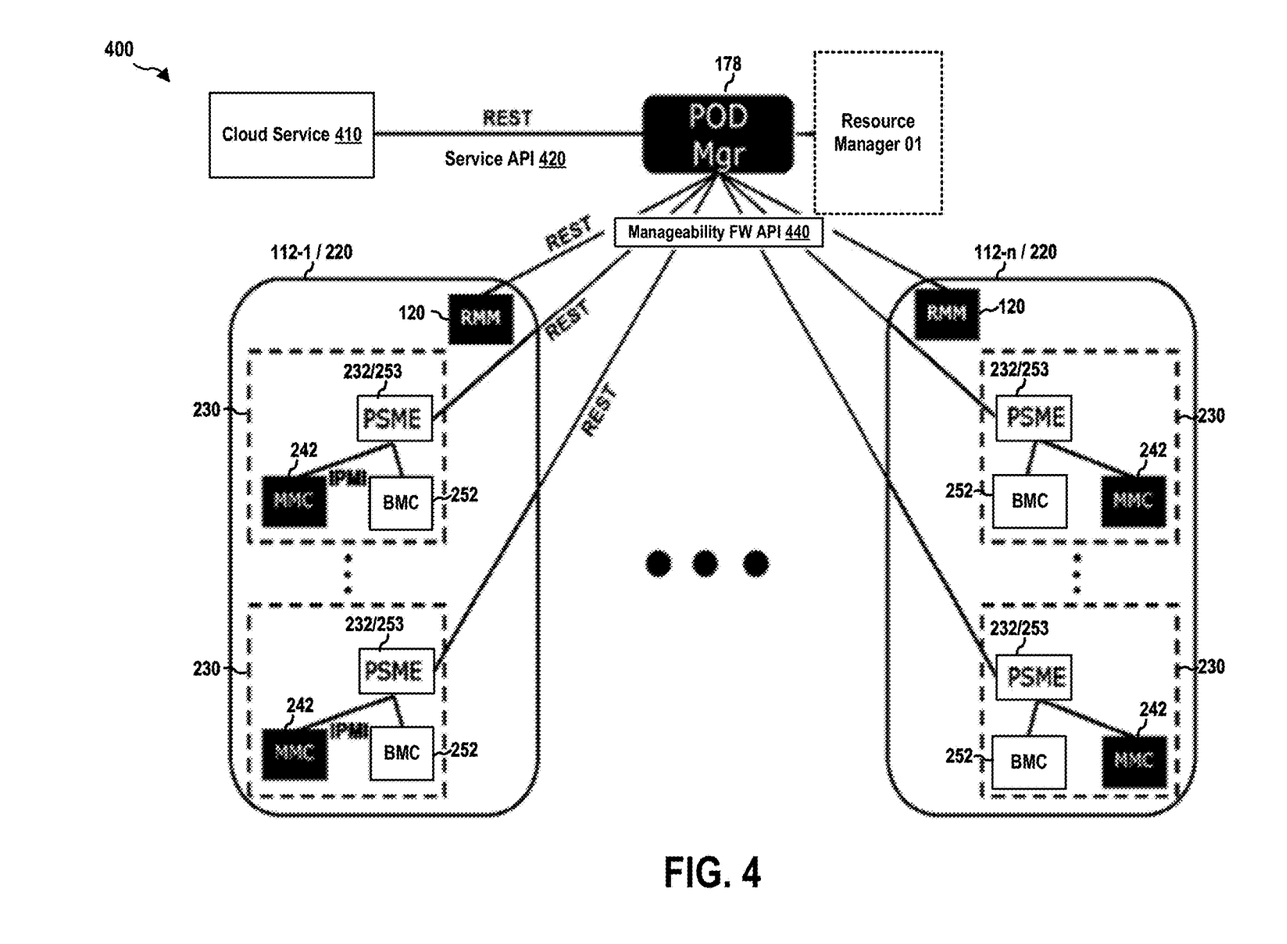
FIG. 4 is a diagram illustrating a rack management structure of a computer system.

FIG. 4 is a diagram illustrating a rack management structure 400 of the system 100.

In some examples, as shown in FIG. 4, the rack management structure 400 includes various managers and application programming interfaces (APIs). For example, a cloud service 410 may interface through a service API 420 (e.g., orchestration interface) as a common service application interface (API) to communicate with the pod manager 178. The pod manager 178 manages the computing racks 112-1 to 112-n including various types of disaggregated physical elements (e.g., the computing drawer 230).

In certain configurations, the pod manager 178 may include a resource manager 401 that includes logic and/or features capable of allocating these disaggregated physical elements (e.g., the compute modules 126, the memory modules 132, the storage modules 138, the network modules 144) responsive to a request from a cloud service 410 to allocate configurable computing resources to a composed machine to implement or execute a workload that may be associated with the cloud service 410. The workload, for example, may be an application workload such as, but not limited to, video processing, encryption/decryption, a web server, content delivery or a database. The resource manager 401 may maintain a resource catalog to track what configurable computing resources have been allocated and also what configurable computing resources may be available to allocation responsive to subsequent requests from the cloud service 410.

In certain configurations, the pod manager 178 may utilize a manageability firmware (FW) API 440, which is a Representational State Transfer (REST)-based API, to access to the configurable computing resources at the computing racks 112-1 to 112-n. This access may include access to disaggregated physical elements maintained at racks as well as metadata for technologies deployed in these racks that may include gathered operating attributes for these disaggregated physical elements. In particular, the manageability FW API 440 provides access to the RMM 120 and the PSME 232 (e.g., the compute PSME 128, the memory PSME 134, the storage PSME 140, and the network PSME 146)/the PSME 253 of each computing drawer 230 in the computing racks 112-1 to 112-n. As described supra, the PSME 253 may be implemented by the same service processor that implements the BMC function 252 on a computing blade 250.

REST or RESTful Web services are one way of providing interoperability between computer systems on the Internet. REST-compliant Web services allow requesting systems to access and manipulate textual representations of Web resources using a uniform and predefined set of stateless operations. In a RESTful Web service, requests made to a resource's URI will elicit a response that may be in XML, HTML, JSON or some other defined format. The response may confirm that some alteration has been made to the stored resource, and it may provide hypertext links to other related resources or collections of resources. Using HTTP, as is most common, the kind of operations available include those predefined by the HTTP verbs GET, POST, PUT, DELETE and so on. By making use of a stateless protocol and standard operations, REST systems aim for fast performance, reliability, and the ability to grow, by re-using components that can be managed and updated without affecting the system as a whole, even while it is running.

In certain configurations, the RMM 120 may also provide access to the physical and logical asset landscapes or mapping in order to expedite identification of available assets and allocate configurable computing resources responsive to requests to compose or place a composed machine to implement or execute a workload.

In certain configurations, the RMM 120 may provide a rack level user interface in order to fulfill several basic functions, such as discovery, reservation, polling, monitoring, scheduling and usage. Also, the RMM 120 may be utilized for assembly of higher order computing resources in a multi-rack architecture (e.g., to execute a workload).

In certain configurations, the RMM 120 may report assets under its management to the pod manager 178 that includes the resource manager 401. For these examples, resource manager 401 may include logic and/or features capable of assisting the pod manager 178 in aggregating an overall physical asset landscape structure from all racks included in the pod of racks managed by the pod manager 178 into a single multi-rack asset. According to some examples, the RMM 120 may also receive and/or respond to requests from the pod manager 178 via the manageability FW API 440 (i.e., a REST API).

According to some examples, the pod manager 178 may receive a request to allocate a portion of the configurable computing resources maintained in the computing racks 112-1 to 112-n. For these examples, the pod manager 178 may receive the request through the service API 420 in a standardized protocol format such as the Open Virtualization Format (OVF). OVF may include hints (e.g., metadata) of a type of workload. The pod manager 178 may be capable of determining what hardware configuration may be needed to place or compose a composed machine to implement or execute the workload. The pod manager 178 may then forward the request and indicate the hardware configuration possibly needed to the resource manager 401. For example, a configuration of configurable computing resources including various types of disaggregate physical elements such as CPUs, memory, storage and NW I/O needed to implement, run, or execute the workload.

The pod manager 178 may discover and communicate with the RMM 222 of each computing rack 220 and the PSME 232 of each computing drawer 230.

Referring back to FIG. 2, in this example, the computing blade 250, among other components, includes the service processor 251. As described infra, the service processor 251 may implement the BMC function 252 and the PSME 253. As such, each computing drawer 230 of the computing rack 220 may not need a separate micro-controller or other computing device to implement a PSME. In other words, the computing drawer 230 does not include the PSME 232.

The PSME 253 implemented by the service processor 251 (in any blade of the computing rack 220) may provide functions and APIs similar to those of the PSME 232 with some differences noted here. For example, the PSME 253 of a particular computing blade 250 may not discover or service all the BMCs, MEs, and BIOSes in all the other blades of the computing drawer 230. Rather, the PSME 253 of that particular computing blade 250 may only discover and service the BMC function 252, the BIOS 256, and/or the ME 254 of that particular computing blade 250.

On the other hand, the pod manager 178 may discover all the PSMEs in the pod (i.e., the PSME 253 of each blade in the computing racks 112-1 to 112-n). Each PSME 253 may provide information of the BMC/BIOS/ME on the same blade and serviced by that PSME 253 to the pod manager 178. Further, one PSME 253 of a particular computing blade 250 may service the corresponding computing drawer 230 (i.e., the drawer containing the particular computing blade 250) at the draw level, similar to that the PSME 232 services the computing drawer 230 at the drawer level (e.g., providing information regarding the computing drawer to the pod manager 178).

Figure 5:
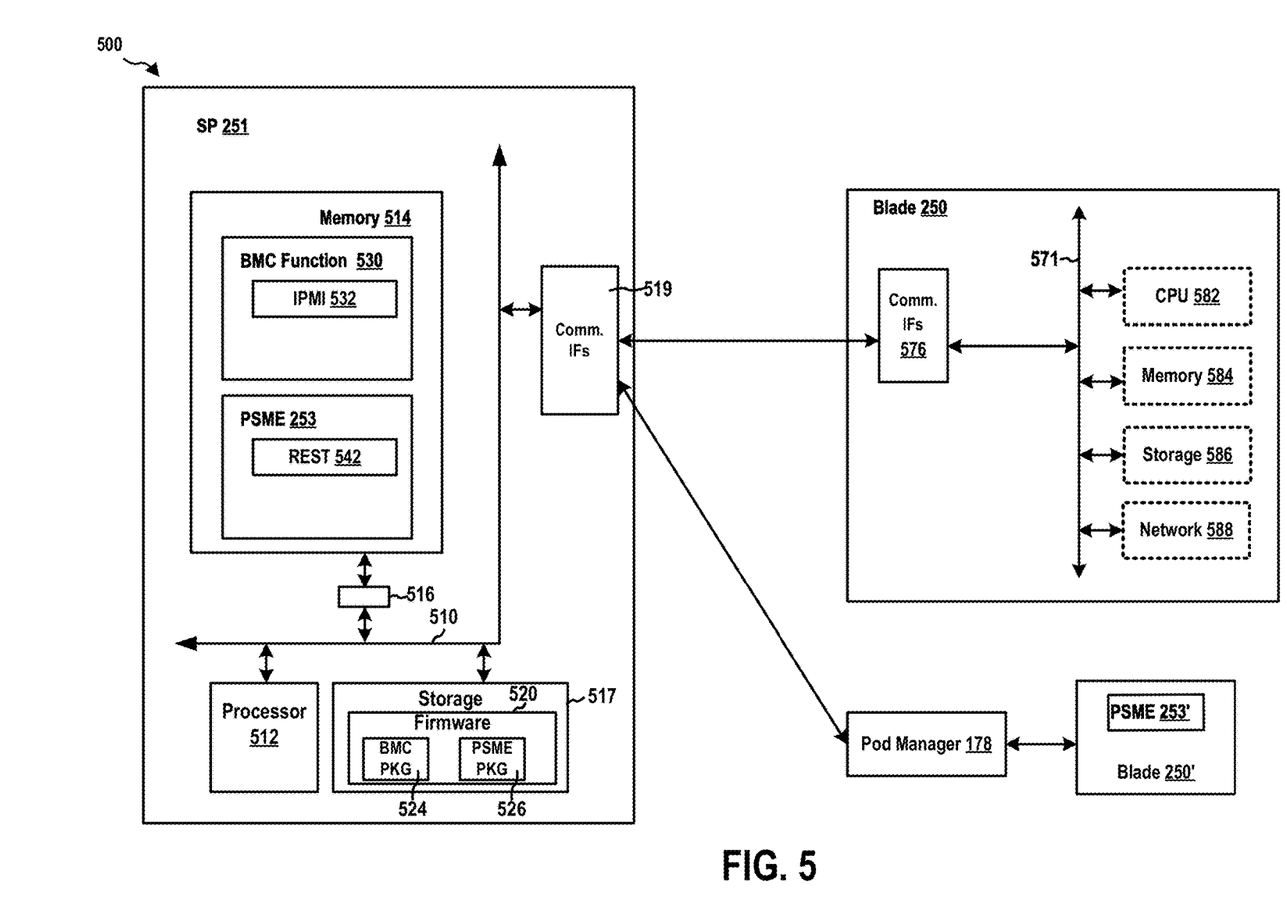
FIG. 5 is a diagram illustrating a computing blade system.

FIG. 5 is a diagram 500 illustrating a computing blade system. In this example, the computing blade system includes, among other devices, the computing blade 250 and the service processor 251 of the computing blade 250. The service processor 251 has a processing unit 512, a memory 514, a memory driver 516, a storage 517, and communication interfaces 519 such as an LPC interface, a network interface card, a general-purpose input/output (GPIO) interface, a keyboard controller style (KCS), a server management interface chip (SMIC), a block transfer (BT) interface, a system management bus system interface (SSIF), a Universal Serial Bus (USB) interface, and/or other suitable communication interface(s). In certain configurations, one or more of the above components may be implemented as a system-on-a-chip (SoC). For examples, the processing unit 512, the memory 514, and the storage 517 may be on the same SoC. The memory 514, the processing unit 512, the memory driver 516, the storage 517, and/or the communication interfaces 519 may be in communication with each other through a communication channel 510 such as a bus architecture.

The service processor 251 may store SP firmware 520 in the storage 517. When the processing unit 512 executes the SP firmware 520, the processing unit 512 loads code and data of the SP firmware 520 into the memory 514. In this example, the SP firmware 520 includes a BMC package 524 and a PSME package 526. The BMC package 524 includes executable code of the BMC function 252. The processing unit 512 executes the BMC package 524 to load the BMC function 252 into the memory 514. Similarly, the PSME package 526 includes executable code of the PSME 253. The processing unit 512 executes the PSME package 526 to load the PSME 253 into the memory 514.

This example shows that the SP firmware 520 provides in the memory 514, among other components, the BMC function 252 and the PSME 253. Further, the BMC function 252 may include an Intelligent Platform Management Interface (IPMI) service 538. The IPMI service 538 may implement an IPMI interface over one or more interfaces of the communication interfaces 519. The IPMI service 538 may receive and send IPMI messages through the IPMI interface. IPMI is an industry standard and is described in, e.g., "IPMI: Intelligent Platform Management Interface Specification, Second Generation, v.2.0, Feb. 12, 2004," which is incorporated herein by reference in its entirety. IPMI defines a protocol, requirements and guidelines for implementing a management solution for server-class computer systems. The features provided by the IPMI standard include power management, system event logging, environmental health monitoring using various sensors, watchdog timers, field replaceable unit information, in-band and out of band access to the management controller, simple network management protocol (SNMP) traps, etc.

The service processor 251 may be in communication with the computing blade 250 through the communication interfaces 519 and host communication interfaces 576 on the computing blade 250. The BMC function 252 of the service processor 251 may manage the computing blade 250. The computing blade 250 includes, among other components, one or more of a CPU component 582, a memory component 584, a storage component 586, and a network component 588. The CPU component 582, the memory component 584, storage component 586, and/or the network component 588 on the computing blade 250 and the host communication interfaces 576 may be in communication with each other through a blade communication channel 571. The blade communication channel 571 may be a bus architecture.

Further, the PSME 253 of the service processor 251 may include REST services 542. The pod manager 178 may access the REST services 542 through the communication interfaces 519. The REST services 542 provide the REST-based interface that allows full management of the PSME 253, including asset discovery and configuration. For example, the REST services 542 may be a REDFISH® server. REDFISH® is an open industry standard specification and schema that specifies a RESTful interface and utilizes JSON and OData for the management of scale-out computing servers and for accessing data defined in model format to perform out-of-band systems management. The REST services 542 may support some or all of the requirements of "Redfish Scalable Platforms Management API Specification, Version: 1.0.0, Document Identifier: DSP0266, Date: 2015 Aug. 4," which is incorporated herein in its entirety by reference.

In certain configurations, the PSME 253 may service the computing blade 250 on which the service processor 251 implementing the PSME 253 is located, but not the other blades of the same computing drawer 230.

Further, one PSME 253 in the computing drawer 230 may provide to the pod manager 178 information of and functions to operate on that drawer at the drawer level. In this example, the PSME 253 of the same computing blade 250 may service the computing drawer 230 at the drawer level. In contrast, a PSME 253' of a computing blade 250' of the computing drawer 230 only services the computing blade 250' as described supra.

1. Functions

Based on the type of the computing blade 250 (e.g., a compute blade), the PSME 253 may provide to the pod manager 178 information of and functions to operate on a processor collection resource, which provides collection of all processors available in a blade.

Based on the type of the computing blade 250 (e.g., a memory blade or a compute blade including a memory), the PSME 253 may provide to the pod manager 178 information of and functions to operate on a memory collection resource, which provides collection of all memory modules installed in a computer system. Based on the type of the computing blade 250 (e.g., a memory blade or a compute blade including a memory), the PSME 253 may also provide information of and functions to operate on a memory chunks collection resource, which provides collection of all memory chunks in a computer system.

Based on the type of the computing blade 250 (e.g., a storage blade), the PSME 253 may provide to the pod manager 178 information of and functions to operate on a storage adapters collection resource, which provides collection of all storage adapters available in a blade. The PSME 253 may also provide to the pod manager 178 information of and functions to operate on a storage adapter resource, which provides detailed information about a single storage adapter identified by adapter ID.

Based on the type of the computing blade 250 (e.g., a storage blade), the PSME 253 may provide to the pod manager 178 information of and functions to operate on a storage device collection resource, which provides collection of all storage devices available in a storage adapter. The PSME 253 may also provide to the pod manager 178 information of and functions to operate on a device resource, which provides detailed information about a single storage device identified by device ID.

Based on the type of the computing blade 250 (e.g., a networking blade), the PSME 253 may provide to the pod manager 178 information of and functions to operate on a Blade Network Interface resource, which provides detailed information about a network interface identified by NIC ID.

When the PSME 253 also service the computing drawer 230 at the drawer level, the PSME 253 may provide to the pod manager 178 information of and functions to operate on a manager collection resource, which provides collection of all managers available in the computing drawer 230. The PSME 253 may provide to the pod manager 178 information of and functions to operate on chassis collection resource, a chassis resource. a computer systems collection, and a computer system resource, The PSME 253 may provide to the pod manager 178 information of and functions to operate on one or more of the following: a manager resource that provides detailed information about a manager identified by manager ID; a switch collection resource that provides collection of all switches available in a fabric module; a switch resource that provides detailed information about a switch identified by switch ID; a switch port collection resource that provides collection of all switch port available in a switch; a switch port resource that provides detailed information about a switch port identified by port ID; a switch ACL collection resource that provides collection of all Access Control List (ACL) defined on switch; a switch ACL resource that provides detailed information about a switch Access Control List defined on switch; a switch ACL rule collection resource that provides collection of all rules for Access Control List (ACL) defined on switch; a switch ACL rule resource that provides detailed information about a switch ACL rule defined identified by rule ID; a switch port static MAC collection resource that provides collection of all static MAC forwarding table entries; a switch port static MAC resource that provides detailed information about a static MAC address forward table entry; a network protocol resource that provides detailed information about all network services supported by a manager identified by manager ID; a Ethernet interface collection resource that provides collection of all Ethernet interfaces supported by a manager identified by manager ID or included in a blade identified by blade ID; a Ethernet interface resource that provides detailed information about a Ethernet interface identified by NIC ID; a VLAN Network Interface collection resource that provides collection of all VLAN network interfaces existing on a switch port identified by port ID or network interface identified by NIC ID; a VLAN Network Interface resource that provides detailed information about a VLAN network interface identified by VLAN ID; an event service resource responsible for sending events to subscribers; an event subscription collection, which is a collection of Event Destination resources; an event subscription contains information about type of events user subscribed for and should be sent; and a definition of event array that is POST-ed by Event Service to active subscribers, event array representing the properties for the events themselves and not subscriptions or any other resource, each event in this array having a set of properties that describe the event.

In certain configurations, after the processing unit 512 executes the BMC package 524 and the PSME package 526 to load (e.g., via a loader) both the BMC function 252 and the PSME 253 into the memory 514, the service processor 251 may further configure the PSME 253 based on the type of the computing blade 250. In particular, after the BMC function 252 is running, the BMC function 252 may gather hardware information from the computing blade 250. Based on the hardware information, the BMC function 252 (or another component of the service processor 251) can determine whether the computing blade 250 is a processor type, a memory type, a storage type, a network type, or some other types. For example, when the computing blade 250 is from a compute module 126 and include one or more processors on the blade, the service processor 251 will retrieve information (e.g., processor model number) regarding the one or more processors from the computing blade 250. Based on the information regarding the one or more processors, the service processor 251 can determine that the computing blade 250 is a processor type. As described supra, the computing drawer 230 containing the computing blade 250 would be the same type as the computing blade 250, as the computing drawer 230 only contains blades that are the same type.

In a first technique, once the service processor 251 has determined the type of the computing blade 250, the service processor 251 can configure the PSME 253 running to have a configuration (or "personality") corresponding to that type.

For example, if the functions as described supra of the PSME 253 have not been initiated, the PSME 253 may then only initiate a subset of the functions that are designated to service the computing blade 250 in accordance with the determined type. The PSME 253 may decide not to initiate the rest of the functions, as the PSME 253 will not use those functions to service the computing blade 250 of the determined type. As such, the PSME 253 has been assigned a personality of the determined type (e.g., a processor type.)

In this example, the service processor 251 determines that the computing blade 250 is a processor type. Accordingly, the PSME 253 may be configured to, among other actions, initiate the functions to operate on the processor collection resource, but not to initiate the functions to operate on the storage device collection resource.

Further, if the functions as described supra of the PSME 253 have been initiated, the PSME 253 may disable the functions of the PSME 253 that are not designated to service the first computing blade in accordance with the determined type. Subsequently, only a subset of the functions of the PSME 253 that are designated to service the computing blade 250 in accordance with the determined type will remain enabled and functional.

In this example, the service processor 251 determines that the computing blade 250 is a processor type. Accordingly, when the functions to operate on the processor collection resource and the functions to operate on the storage device collection-are both enabled, the PSME 253 may be configured to, among other actions, disable the functions to operate on the storage device collection resource, but not to disable the functions to operate on the processor collection resource.

In a second technique, the processing unit 512 initially executes the BMC package 524 to load the BMC function 252. After the BMC function 252 is loaded and running, but prior to that the PSME 253 is loaded, the BMC function 252 gathers hardware information from the computing blade 250. As described supra, based on the hardware information, the service processor 251 can determine the type of the computing blade 250 and the computing drawer 230. Subsequently, a component of the service processor 251 (e.g., a loader) may configure booting options of the PSME package 526 such that only components of the PSME package 526 supporting the determined type are to be executed by the processing unit 512. For example, the service processor 251 my edit a configuration file to indicate that only components of the PSME package 526 supporting the determined type are to be executed. Consequently, the PSME 253 is loaded with only a subset of the functions that are designated to service the computing blade 250 in accordance with the determined type, but not loaded with the rest of the functions as the PSME 253 will not use those functions to service the computing blade 250 of the determined type.

In an example, the service processor 251 determines that the computing blade 250 is a processor type. Accordingly, prior to executing the PSME package 526 to load the PSME 253, the service processor 251 configures the PSME package 526 to include components supporting the functions to operate on the processor collection resource and to exclude the functions to operate on the storage device collection resource. As such, when the PSME 253 is loaded and running, it will have functions to operate on the processor collection resource enabled and functions to operate on the storage device collection resource disabled.

Figure 6:
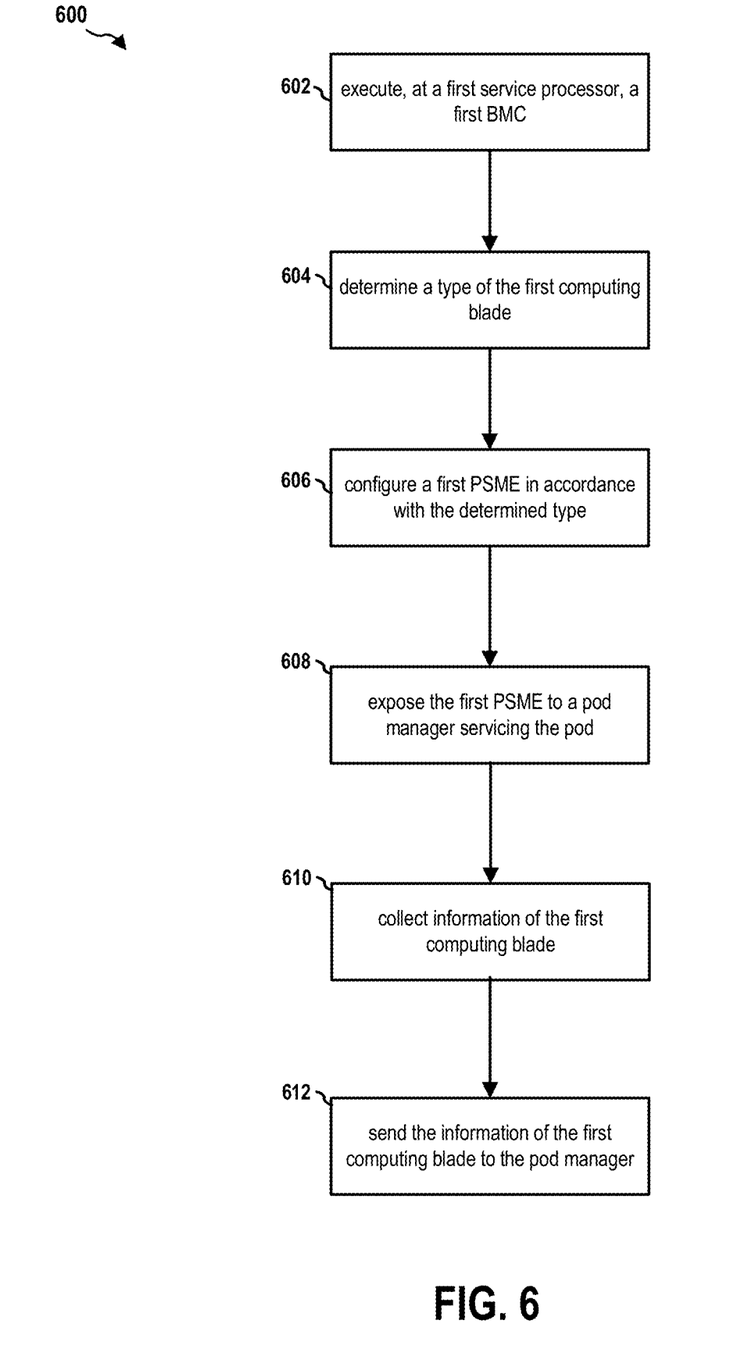
FIG. 6 is a flow chart of a method (process) for operating a service processor.

FIG. 6 is a flow chart 600 of a method (process) for operating a computing pod. The computing pod includes one or more computing racks. Each of the one or more computing racks includes one or more computing drawers. Each of the computing drawers includes one or more computing modules. Each of the one or more computing modules includes a computing blade. A first service processor is on a first computing blade of a first computing drawer of the one or more computing drawers of a first computing rack of the one or more computing racks.

At operation 602, the first service processor executes a first BMC function. The first BMC function manages the first computing blade. At operation 604, the first service processor determines a type of the first computing blade. At operation 606, the first service processor configures a first PSME in accordance with the determined type. At operation 608, the first service processor exposes the first PSME to a pod manager servicing the pod. At operation 610, the first PSME collects information of the first computing blade. At operation 612, the first PSME sends the information of the first computing blade to the pod manager.

In certain configurations, the type of the first computing blade is determined by the first BMC function based on hardware information of the first computing blade. In certain configurations, to configure a first PSME, the first service processor initiates functions that are designated to service the first computing blade in accordance with the determined type. In certain configurations, to configure a first PSME, the first service processor disables functions of the first PSME that are not designated to service the first computing blade in accordance with the determined type.

In certain configurations, the first service processor boots the first PSME from executable code of the first PSME. The configuring the first PSME is executed after the first PSME is booted.

In certain configurations, to configure a first PSME, the first service processor configures booting options of executable code of the first PSME prior to booting the first PSME from the executable code such that the booted first PSME provides functions that are designated to service the first computing blade. The first service processor boots the first PSME from the executable code in accordance with the configured booting options.

In certain configurations, the type of the first computing blade is determined to be at least one of a processor type, a memory type, a storage type, and a network type. The first PSME includes functions designated for each of the processor type, the memory type, the storage type, and the network type.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of operating a computing pod including one or more computing racks, comprising:
    executing, at a first service processor, a first baseboard management controller (BMC) function, wherein each of the one or more computing racks includes one or more computing drawers, each of the computing drawers includes one or more computing modules, each of the one or more computing modules includes a computing blade, the first service processor is on a first computing blade of a first computing drawer of the one or more computing drawers of a first computing rack of the one or more computing racks, and the first BMC function manages the first computing blade;
    gathering, by the BMC function, hardware information of the first computing blade;
    determining, at the first service processor, a type of the first computing blade based on the hardware information gathered by the BMC function;
    enabling, at the first service processor, functionalities of a first pooled system management engine (PSME) in accordance with the determined type;
    exposing, at the first service processor, the first PSME to a pod manager servicing the computing pod;
    collecting, at the first PSME, information of the first computing blade; and
    sending, at the first PSME, the information of the first computing blade to the pod manager.

2. The method of claim 1, wherein the configuring a first PSME further comprises initiate functions that are designated to service the first computing blade in accordance with the determined type.

3. The method of claim 1, wherein the configuring a first PSME further comprises disabling functions of the first PSME that are not designated to service the first computing blade in accordance with the determined type.

4. The method of claim 1, further comprising: booting the first PSME from executable code of the first PSME, wherein the configuring the first PSME is executed after the first PSME is booted.

5. The method of claim 1, wherein the configuring the first PSME further comprises configuring booting options of executable code of the first PSME prior to booting the first PSME from the executable code such that the booted first PSME provides functions that are designated to service the first computing blade, the method further comprising:
    booting the first PSME from the executable code in accordance with the configured booting options.

6. The method of claim 1, wherein the type of the first computing blade is determined to be at least one of a processor type, a memory type, a storage type, and a network type, wherein the first PSME includes functions designated for each of the processor type, the memory type, the storage type, and the network type.

7. A computing pod, comprising:
    one or more computing racks, wherein each of the one or more computing racks includes one or more computing drawers, each of the computing drawers includes one or more computing modules, each of the one or more computing modules includes a computing blade, a first service processor is on a first computing blade of a first computing drawer of the one or more computing drawers of a first computing rack of the one or more computing racks;
    wherein the first service processor includes:
        a memory; and
        at least one processor coupled to the memory and configured to:
            execute, at a first service processor, a first baseboard management controller (BMC) function, wherein the first BMC function manages the first computing blade;
            gather, by the BMC function, hardware information of the first computing blade;
            determine, at the first service processor, a type of the first computing blade based on the hardware information gathered by the BMC function;
            enable, at the first service processor, functionalities of a first pooled system management engine (PSME) in accordance with the determined type;
            expose, at the first service processor, the first PSME to a pod manager servicing the computing pod;
            collect, at the first PSME, information of the first computing blade; and
            send, at the first PSME, the information of the first computing blade to the pod manager.

8. The computing pod of claim 7, wherein to configure the first PSME, the at least one processor is further configured to initiate functions that are designated to service the first computing blade in accordance with the determined type.

9. The computing pod of claim 7, wherein to configure the first PSME, the at least one processor is further configured to disable functions of the first PSME that are not designated to service the first computing blade in accordance with the determined type.

10. The computing pod of claim 7, wherein the at least one processor is further configured to boot the first PSME from executable code of the first PSME, wherein the configuring the first PSME is executed after the first PSME is booted.

11. The computing pod of claim 7, wherein to configure the first PSME, the at least one processor is further configured to:
    configure booting options of executable code of the first PSME prior to booting the first PSME from the executable code such that the booted first PSME provides functions that are designated to service the first computing blade; and boot the first PSME from the executable code in accordance with the configured booting options.

12. The computing pod of claim 7, wherein the type of the first computing blade is determined to be at least one of a processor type, a memory type, a storage type, and a network type, wherein the first PSME includes functions designated for each of the processor type, the memory type, the storage type, and the network type.

13. Non-transitory computer-readable media storing computer executable code for operating a computing nod including one or more computing racks, each of the one or more computing racks including one or more computing drawers, each of the computing drawers including one or more computing modules, each of the one or more computing modules including a computing blade, a first service processor being on a first computing blade of a first computing drawer of the one or more computing drawers of a first computing rack of the one or more computing racks, the computer-readable media comprising:
a first computer-readable medium, including code to instruct a first service processor to:
execute a first baseboard management controller (BMC) function, wherein the first BMC function manages the first computing blade;
gather, by the BMC function, hardware information of the first computing blade;
determine a type of the first computing blade based on the hardware information gathered by the BMC function;
enable functionalities of a first pooled system management engine (PSME) in accordance with the determined type;
expose the first PSME to a pod manager servicing the computer-readable media;
collect, at the first PSME, information of the first computing blade; and
send, at the first PSME, the information of the first computing blade to the pod manager.

14. The non-transitory computer-readable media of claim 13, wherein to configure the first PSME, the code is further configured to initiate functions that are designated to service the first computing blade in accordance with the determined type.

15. The non-transitory computer-readable media of claim 13, wherein to configure the first PSME, the code is further configured to disable functions of the first PSME that are not designated to service the first computing blade in accordance with the determined type.

16. The non-transitory computer-readable media of claim 13, wherein the code is further configured to boot the first PSME from executable code of the first PSME, wherein the configuring the first PSME is executed after the first PSME is booted.

17. The non-transitory computer-readable media of claim 13, wherein to configure the first PSME, the code is further configured to:
configure booting options of executable code of the first PSME prior to booting the first PSME from the executable code such that the booted first PSME provides functions that are designated to service the first computing blade; and
boot the first PSME from the executable code in accordance with the configured booting options.

* * * * *